United States Patent
Inaba

(10) Patent No.: US 7,994,583 B2
(45) Date of Patent: Aug. 9, 2011

(54) SEMICONDUCTOR DEVICE INCLUDING N-TYPE AND P-TYPE FINFET'S CONSTITUTING AN INVERTER STRUCTURE

(75) Inventor: Satoshi Inaba, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 212 days.

(21) Appl. No.: 12/119,070

(22) Filed: May 12, 2008

(65) Prior Publication Data

US 2008/0308848 A1 Dec. 18, 2008

(30) Foreign Application Priority Data

May 15, 2007 (JP) .................................. 2007-129579

(51) Int. Cl.
  *H01L 27/092* (2006.01)
(52) U.S. Cl. ........................................ 257/369; 257/903
(58) Field of Classification Search .................... 257/369
  See application file for complete search history.

(56) References Cited

U.S. PATENT DOCUMENTS

| 5,557,231 | A | * | 9/1996 | Yamaguchi et al. | .......... 327/534 |
| 6,864,519 | B2 | | 3/2005 | Yeo et al. | |
| 6,943,405 | B2 | | 9/2005 | Bryant et al. | |
| 6,977,837 | B2 | | 12/2005 | Watanabe et al. | |
| 7,164,175 | B2 | | 1/2007 | Kawasaki et al. | |
| 2005/0094434 | A1 | * | 5/2005 | Watanabe et al. | ............. 365/156 |
| 2006/0105536 | A1 | * | 5/2006 | Cheng et al. | .................. 438/386 |
| 2007/0090468 | A1 | | 4/2007 | Kawasaki et al. | |
| 2007/0108528 | A1 | | 5/2007 | Anderson et al. | |
| 2007/0189060 | A1 | | 8/2007 | Inaba | |
| 2008/0099834 | A1 | * | 5/2008 | Willer | .......................... 257/330 |
| 2008/0308848 | A1 | | 12/2008 | Inaba | |

FOREIGN PATENT DOCUMENTS

| JP | 2003-188273 | 7/2003 |
| JP | 2005-142289 | 6/2005 |
| WO | WO 2005/119763 A1 | 12/2005 |

OTHER PUBLICATIONS

U.S. Appl. No. 11/866,144, filed Oct. 2, 2007, Satoshi Inaba.
E. J. Nowak, et al. "A Functional FinFET-DGCMOS SRAM Cell", International Electron Devices Meeting (IEDM), Tech., Dig., Dec. 2002, pp. 411-414.
U.S. Appl. No. 12/556,152, filed Sep. 9, 2009, Inaba.
U.S. Appl. No. 12/494,885, filed Jun. 30, 2009, Inaba.

* cited by examiner

*Primary Examiner* — Wael M Fahmy
*Assistant Examiner* — Abul Kalam
(74) *Attorney, Agent, or Firm* — Oblon, Spivak, McClelland, Maier & Neustadt, L.L.P.

(57) ABSTRACT

A semiconductor device according to an aspect of the invention comprises an n-type FinFET which is provided on a semiconductor substrate and which includes a first fin, a first gate electrode crossing a channel region of the first fin via a gate insulating film in three dimensions, and contact regions provided at both end of the first fin, a p-type FinFET which is provided on the semiconductor substrate and which includes a second fin, a second gate electrode crossing a channel region of the second fin via a gate insulating film in three dimensions, and contact regions provided at both end of the second fin, wherein the n- and the p-type FinFET constitute an inverter circuit, and the fin width of the contact region of the p-type FinFET is greater than the fin width of the channel region of the n-type FinFET.

5 Claims, 13 Drawing Sheets x direction

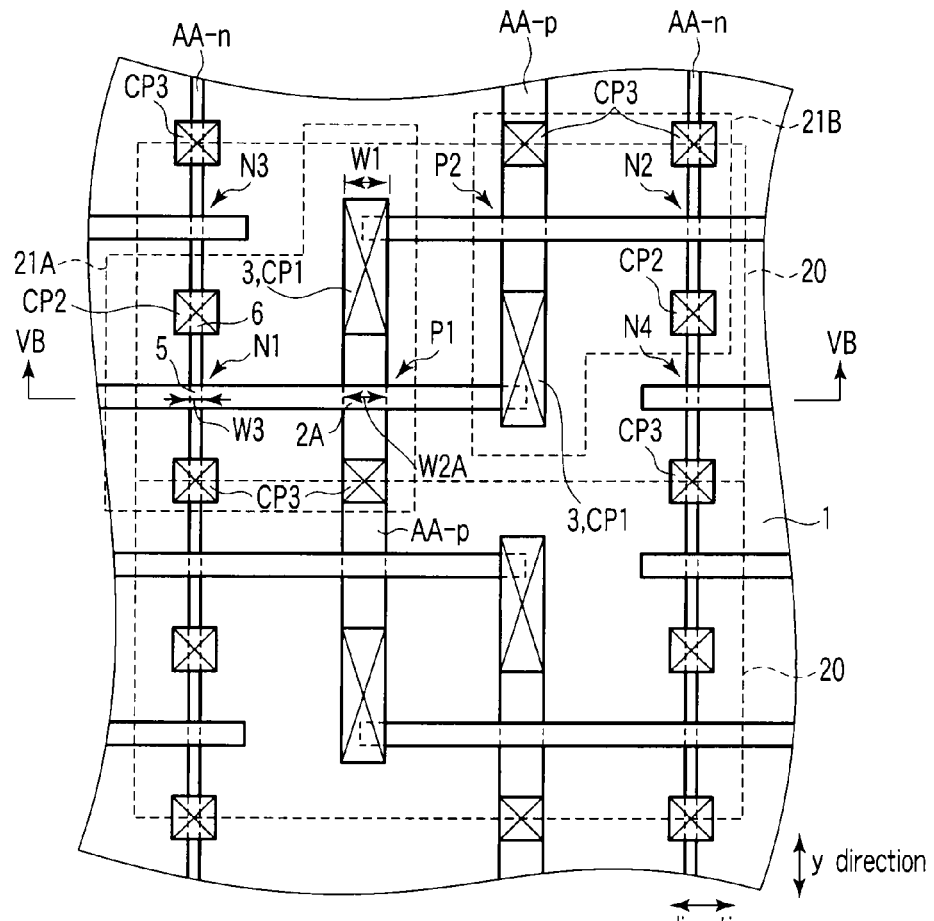
F I G. 5A
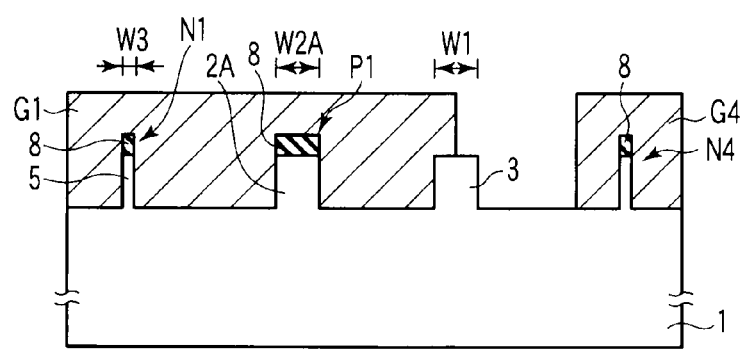
F I G. 5B

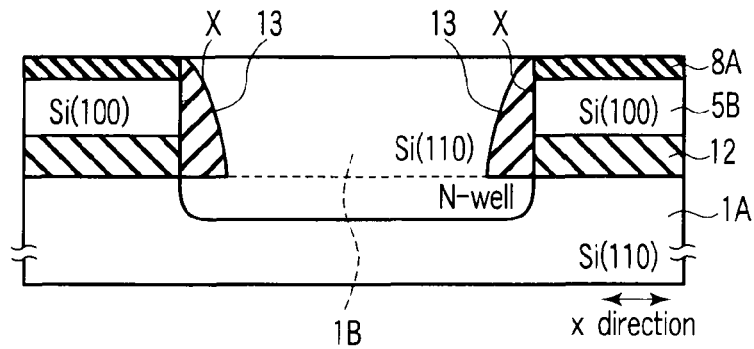
F I G. 9A
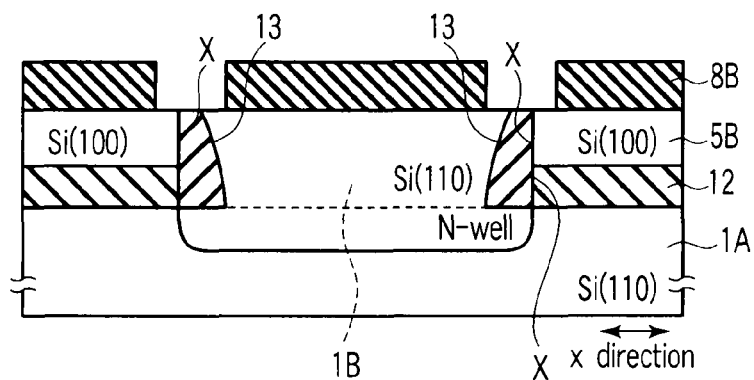
F I G. 9B
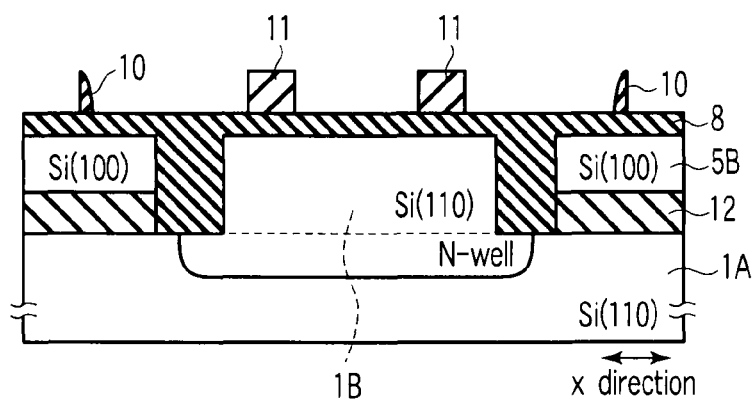
F I G. 9C

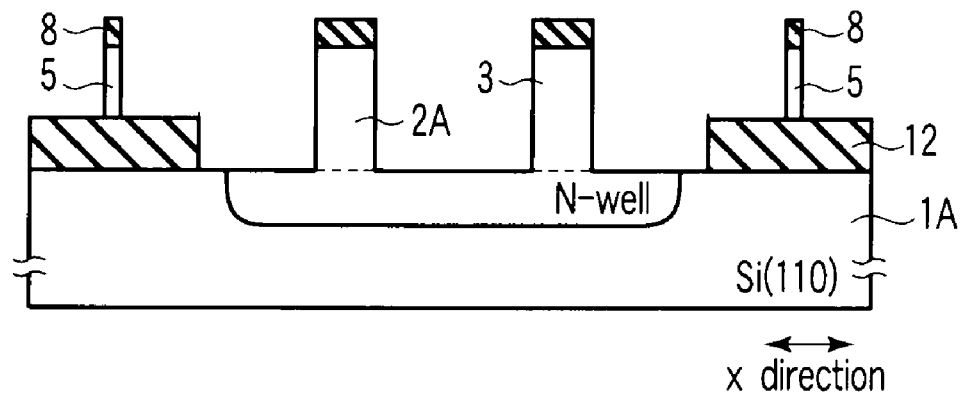
F I G. 10A
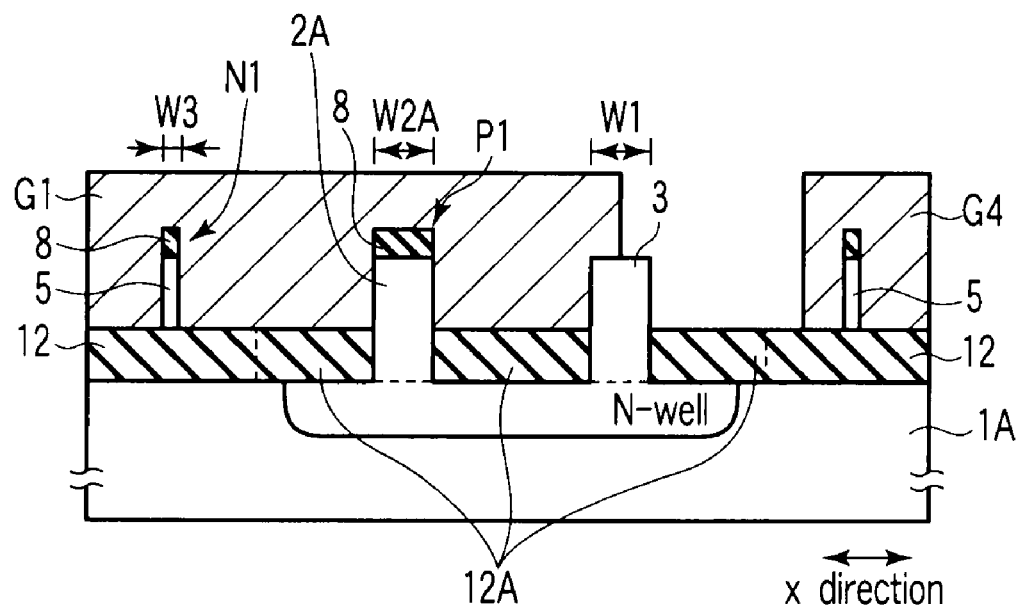
F I G. 10B

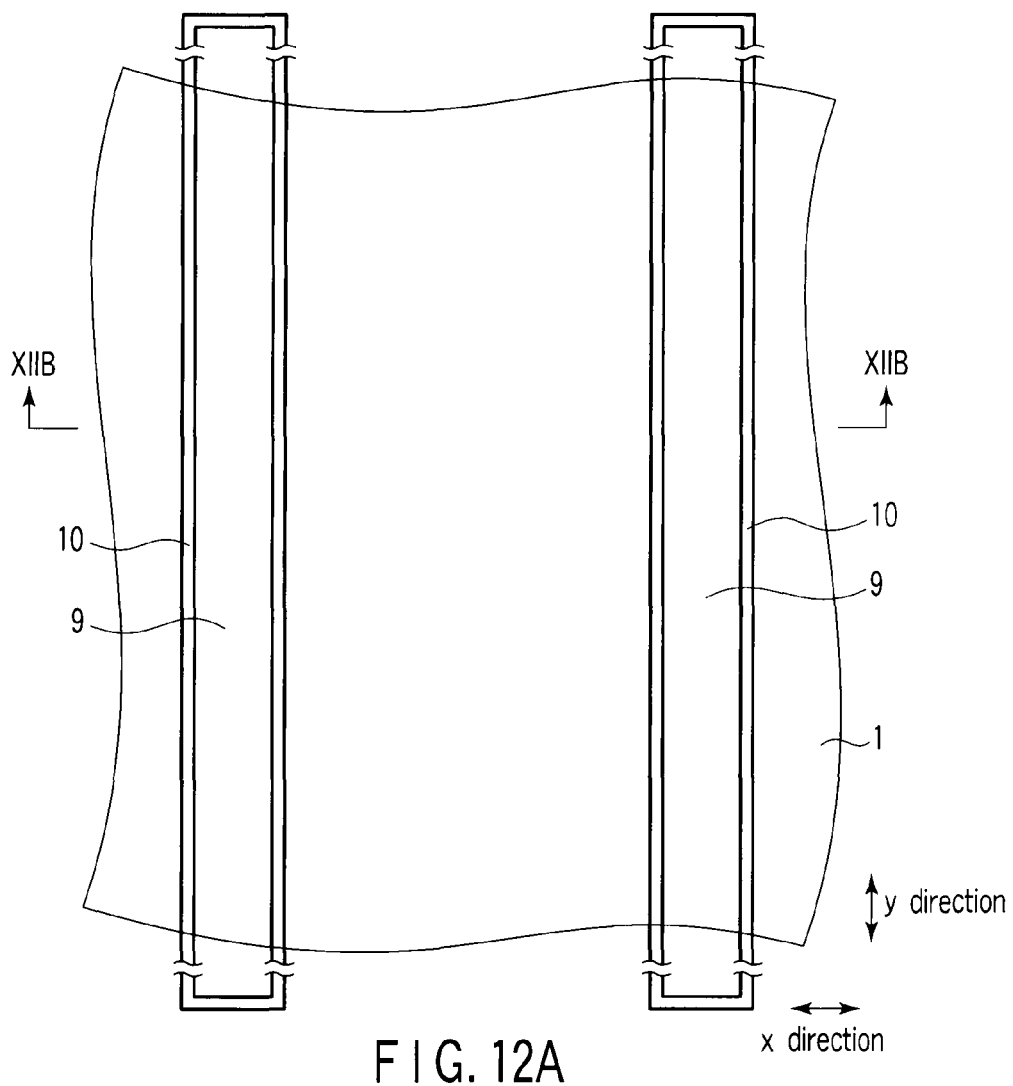
F I G. 12A
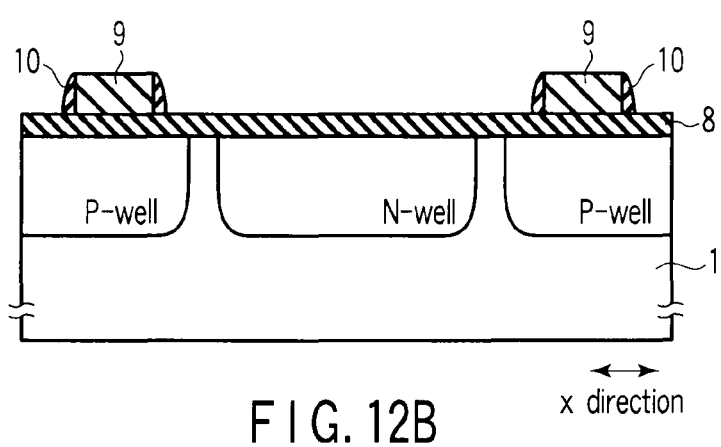
F I G. 12B

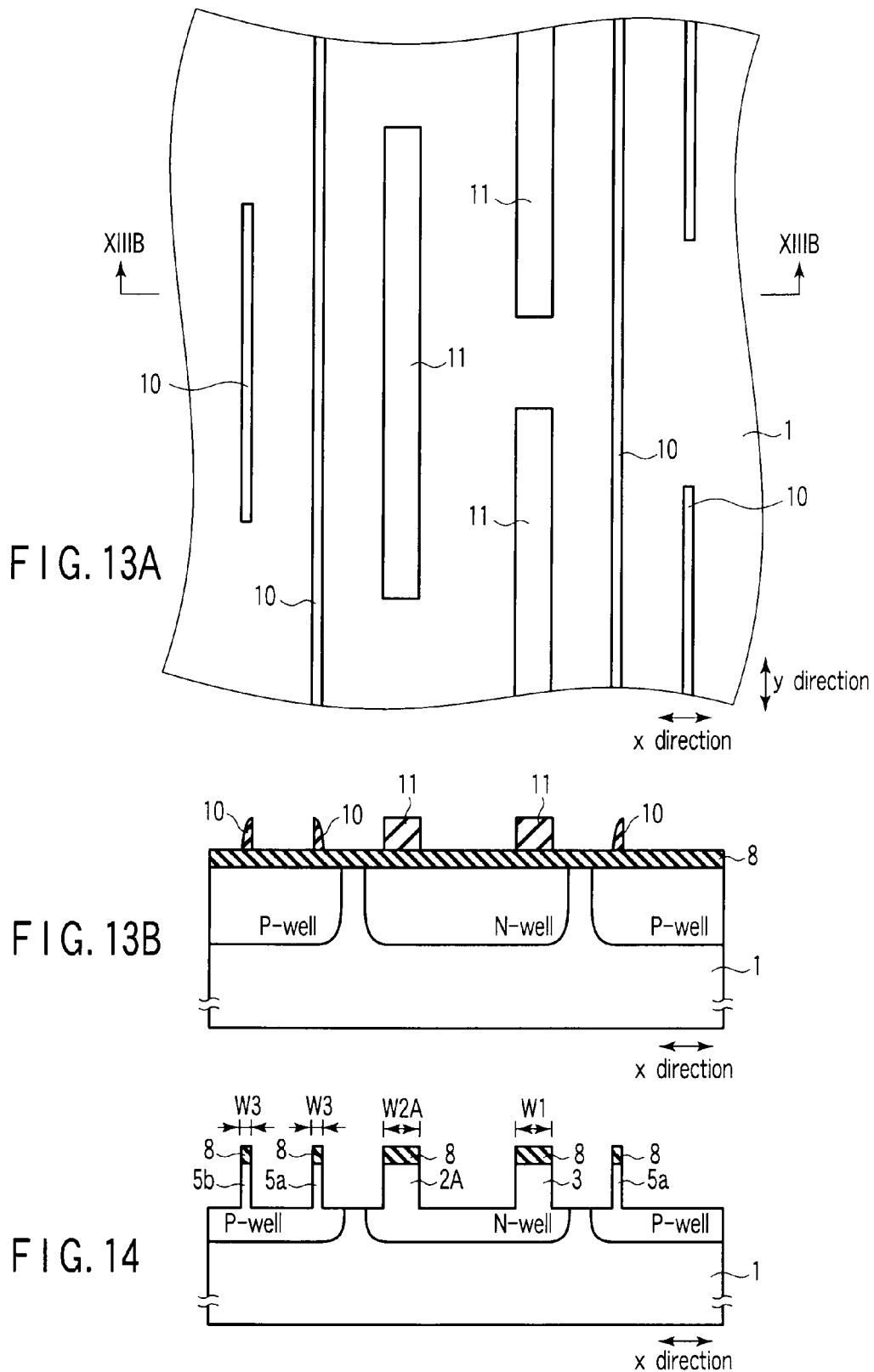

US 7,994,583 B2

SEMICONDUCTOR DEVICE INCLUDING N-TYPE AND P-TYPE FINFET'S CONSTITUTING AN INVERTER STRUCTURE

CROSS-REFERENCE TO RELATED APPLICATIONS

This application is based upon and claims the benefit of priority from prior Japanese Patent Application No. 2007-129579, filed May 15, 2007, the entire contents of which are incorporated herein by reference.

BACKGROUND OF THE INVENTION

1. Field of the Invention

The present invention relates to a semiconductor device, and more particularly to a semiconductor device using FinFETs.

2. Description of the Related Art

The performance of large-scale integrated circuits formed on a silicon substrate has been getting higher.

This has been realized by scaling the gate length and thinning the gate insulating films on the basis of the scaling rule in metal-insulator-semiconductor (MIS) transistors used in logic circuits or memory devices, such as static random access memory (SRAM) devices.

For example, to improve the cut-off characteristic in a short channel region where the channel length is equal to or shorter than 30 nm, a three-dimensional structure MIS transistor where a projecting region (referred to as a fin) obtained by carving a silicon substrate into thin strip and a gate electrode are crossed in three dimensions has been developed.

The three-dimensional structure MIS transistor, which is known as a Fin field-effect transistor (FinFET), has a double gate structure where a top gate and a back gate are provided on one side face and the other side surface of the fin, respectively.

The FinFET is generally a fully depletion-mode MIS transistor. To suppress a short channel effect, the fin width is made shorter than the gate length in the FinFET.

In recent years, the technique for composing an SRAM using the FinFETs has been proposed (e.g., refer to Jpn. Pat. Appln. KOKAI Publication No. 2005-142289).

An SRAM cell is composed of transfer gate transistors and inverter circuits which are connected so as to form a flip-flop to store data. The MIS transistors constituting the inverter circuit include a load transistor composed of a p-type MIS transistor and a driver transistor composed of an n-type MIS transistor.

Normally, the read stability of the SRAM is determined by the current drive power ratio (I ratio) of the transfer gate transistor to the driver transistor. Therefore, the drive power of the driver transistor is made higher than that of the transfer gate transistor, thereby assuring the stability.

When planar MIS transistors have been used as in the conventional art, adjusting both the gate length and the channel width of them enables the current drive power ratio to be adjusted. However, when SRAM cells are composed of FinFETs, since the channel width of the FinFET is determined by the height of the fin, it is generally difficult to change the height from one FinFET to another in terms of processes. Therefore, it is difficult to adjust the current drive power ration (β ratio) of the driver transistor to the transfer gate transistor by changing the height of the fin.

Accordingly, the β ratio of an SRAM cell composed of conventional FinFETs has been adjusted by changing the number of fins of the driver transistor.

BRIEF SUMMARY OF THE INVENTION

According to an aspect of the invention, there is provided a semiconductor device comprising: a semiconductor substrate; an n-type FinFET which is provided on the semiconductor substrate and which includes a first fin acting as an active region, a first gate electrode crossing a channel region of the first fin via a gate insulating film in three dimensions, and contact regions provided at one end and the other end of the first fin and sandwiching the channel region; a p-type FinFET which is provided on the semiconductor substrate and which includes a second fin acting as an active region, a second gate electrode crossing a channel region of the second fin via a gate insulating film in three dimensions, and contact regions provided at one end and the other end of the second fin and sandwiching the channel region, wherein the n-type FinFET and the p-type FinFET constitute an inverter circuit, and the fin width of the contact region of the p-type FinFET to act as an output node of the inverter circuit is greater than the fin width of the channel region of the n-type FinFET.

According to another aspect of the invention, there is provided a semiconductor device comprising: a semiconductor substrate; a first gate electrode provided on the semiconductor substrate; a first n-type FinFET which includes a first fin acting as an active region provided on the semiconductor substrate, a first channel region provided in the first fin in a place where the first gate electrode crosses the first fin via a gate insulating film in three dimensions, and first contact regions provided at one end and the other end of the first fin and sandwiching the first channel region; a first p-type FinFET which includes a second fin acting as an active region provided on the semiconductor substrate, a second channel region provided in the second fin in the place where the first gate electrode crosses the second fin via a gate insulating film in three dimensions, and second contact regions provided at one end and the other end of the second fin and sandwiching the second channel region; second gate electrode provided on the semiconductor substrate; a second n-type FinFET which includes a third fin acting as an active region provided on the semiconductor substrate, a third channel region provided in the third fin in a place where the second gate electrode crosses the third fin via a gate insulating film in three dimensions, and third contact regions provided at one end and the other end of the third fin and sandwiching the third channel region; a second p-type FinFET which includes a fourth fin acting as an active region provided on the semiconductor substrate, a fourth channel region provided in the fourth fin in a place where the second gate electrode crosses the fourth fin via a gate insulating film in three dimensions, and fourth contact regions provided at one end and the other end of the fourth fin and sandwiching the fourth channel region; a first output node which is a node between the first contact region at one end of the first fin and the second contact region at one end of the second fin and is connected to the second gate electrode; a second output node which is a node between the third contact region at one end of the third fin and the fourth contact region at one end of the fourth fin and is connected to the first gate electrode; a third n-type FinFET which includes a fifth fin acting as an active region provided on the semiconductor substrate, a third gate electrode which crosses a fifth channel region of the fifth fin via a gate insulating film in three dimensions, and fifth contact regions provided at one end and the other end of the fifth fin and sandwiching the fifth channel region, one of the fifth contact regions being connected to the first output node; a fourth n-type FinFET which includes a sixth fin acting as an active region provided on the semiconductor substrate, a forth gate electrode which crosses a sixth channel region of the sixth fin via a gate insulating film in three dimensions, and sixth contact regions provided at one end and the other end of the sixth fin and sandwiching the sixth channel region, one of the sixth contact regions being connected to the second output node, wherein the fin width of the second and fourth contact regions constituting the first and second output nodes respectively is greater than the fin width of the first and third channel regions.

BRIEF DESCRIPTION OF THE SEVERAL VIEWS OF THE DRAWING

FIG. 5A is a plan view showing the configuration of a second embodiment of the invention;

FIG. 5B is a sectional view taken along line VB-VB of FIG. 5A;

FIG. 9A is a sectional view to explain a process in a manufacturing method according to the fourth embodiment;

FIG. 9B is a sectional view to explain a process in a manufacturing method according to the fourth embodiment;

FIG. 9C is a sectional view to explain a process in a manufacturing method according to the fourth embodiment;

FIG. 10A is a sectional view to explain a process in a manufacturing method according to the fourth embodiment;

FIG. 10B is a sectional view to explain a process in a manufacturing method according to the fourth embodiment;

FIG. 12A is a plan view to explain one process in a manufacturing method according to the modification;

FIG. 12B is a sectional view taken along line XIIB-XIIB of FIG. 12A;

FIG. 13A is a plan view to explain one process in the manufacturing method according to the modification;

FIG. 13B is a sectional view taken along line XIIIB-XIIIB of FIG. 13A; and FIG. 14 is a sectional view to explain one process in the manufacturing method according to the modification.

DETAILED DESCRIPTION OF THE INVENTION

1. Overview

An embodiment of the invention is characterized in that, in an inverter circuit composed of a p-type FinFET and an n-type FinFET, the width of the contact region of the p-type FinFET serving as a node of the inverter circuit is wider than the fin width in the channel region of the n-type FinFET.

The junction capacitance of the node of the inverter circuit can be increased by increasing the width of the contact region of the p-type FinFET.

Therefore, the drive characteristic of a semiconductor device, such as an SRAM, including such an inverter circuit can be improved.

Hereinafter, in embodiments of the invention, an explanation will be given using an SRAM including an inverter circuit with the aforementioned structure as an example.

2. Embodiments (1) First Embodiment (a) Configuration

Using FIG. 1 to FIG. 2C, a first embodiment of the invention will be explained.

Figure 1:
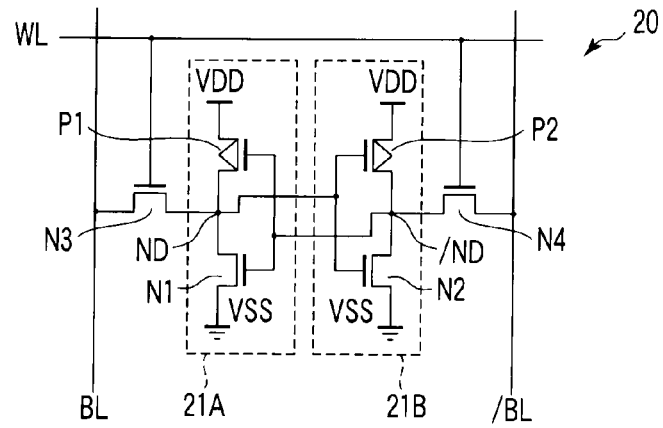
FIG. 1 is an equivalent circuit diagram of an SRAM cell.

FIG. 1 is an equivalent circuit diagram of an SRAM cell 20. As shown in FIG. 1, the SRAM cell 20, which uses six MIS transistors as basic elements, is composed of two inverter circuits 21A, 21B connected so as to form a flip-flop to store data and transfer gate transistors for transferring data.

The inverter circuit 21A is composed of an n-type MIS transistor N1 and a p-type MIS transistor P1. In the SRAM cell 20, the n-type transistor N1 functions as a driver transistor and the p-type MIS transistor P1 functions as a load transistor. The drain of the n-type MIS transistor N1 is connected to the drain of the p-type MIS transistor P1. The connecting point between them is a node ND. Similarly, the inverter circuit 21B is also composed of an n-type MIS transistor N2 and a p-type MIS transistor P2. The n-type MIS transistor N2 functions as a driver transistor and the p-type MIS transistor P2 functions as a load transistor. The connecting point between them is a node/ND.

The node ND is connected to the gates of the n- and p-type MIS transistors N2, P2 in the inverter circuit 21B. The node/ND is connected to the gates of the n- and p-type MIS transistors N1, P1 in the inverter circuit 21A. A power supply potential VDD is supplied to the sources of the p-type MIS transistors P1, P2. A ground potential VSS is supplied to the sources of the n-type MIS transistors N1, N2.

Two transfer gate transistors provided in one SRAM cell 20 are n-type MIS transistors N3, N4. One end (source or drain) of each of the n-type MIS transistors N3, N4 functioning as transfer gate transistors is connected to bit lines BL, /BL, respectively. The other ends (source or drain) of the transistors N3, N4 are connected to the nodes ND, /ND of the inverter circuits 21A, 21B, respectively. The gates of the n-type MIS transistors N3, N4 are connected to word lines WL.

In the first embodiment, each of the transistors P1 to P2, N1 to N4 in the SRAM cell 20 is composed of a FinFET where a fin acting as an active region crosses a gate electrode in three dimensions, thereby forming a MIS transistor.

Figure 2A:
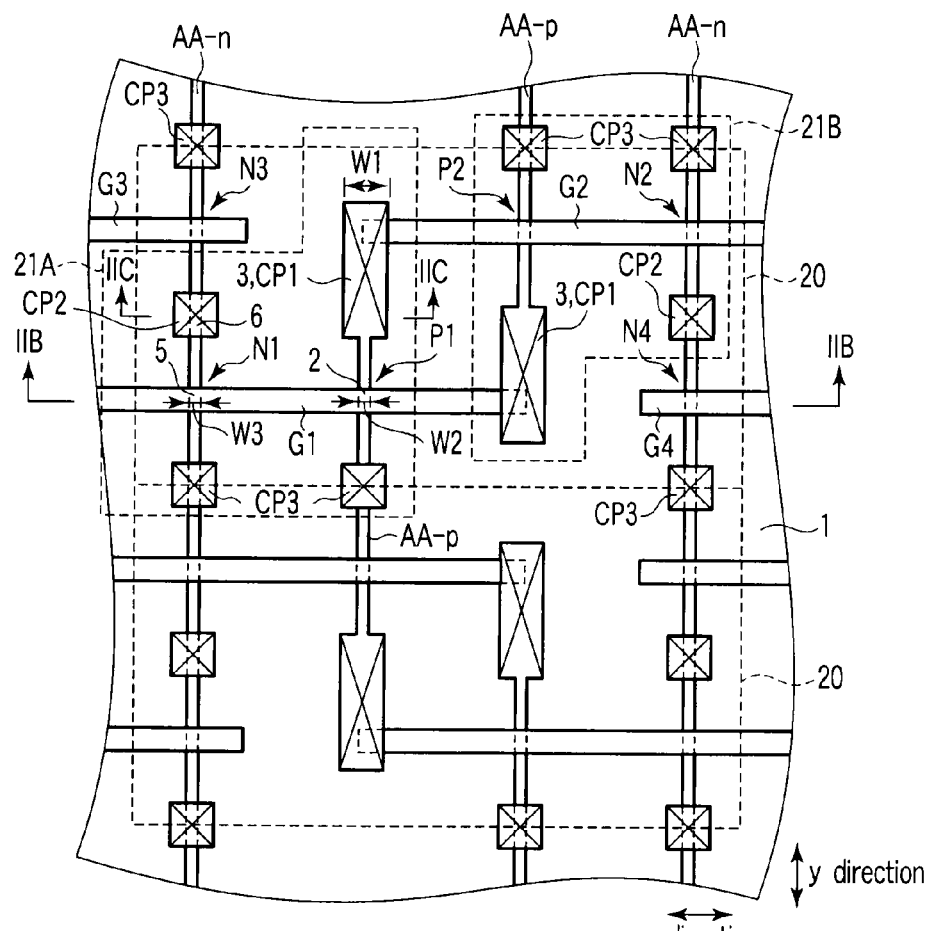
FIG. 2A is a plan view showing the configuration of a first embodiment of the invention.
Figure 2B:
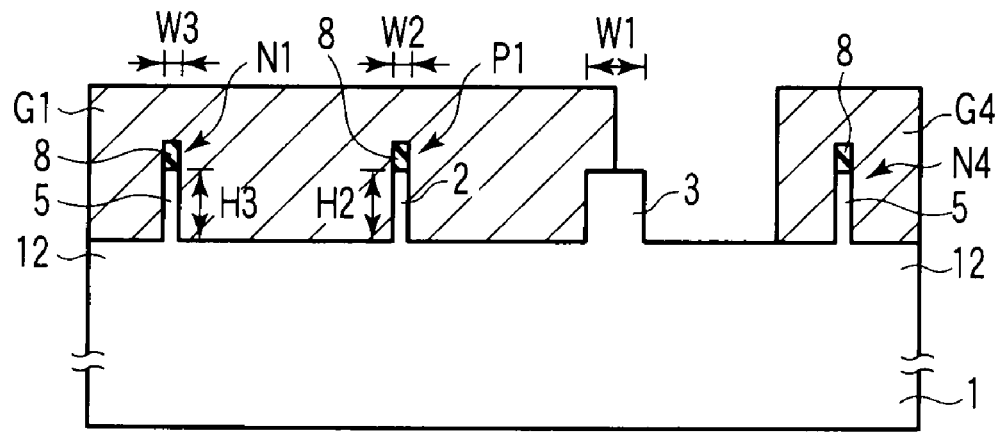
FIG. 2B is a sectional view taken along line IIB-IIB of FIG. 2A.

FIG. 2A is a plan view showing the layout of an SRAM using FinFETs. FIG. 2B is a sectional view taken along line IIB-IIB of FIG. 2A. FIG. 2C is a sectional view taken along line IIC-IIC of FIG. 2A. Hereinafter, for explanation, an interlayer insulating film provided on the semiconductor substrate will be omitted.

In the layout of the SRAM 20 shown in FIG. 2A, each of the active regions AA-n, AA-p of the FinFETs N1 to N4, P1 to P2 is composed of a fin. The fin is a projecting semiconductor region. The fin may be obtained by carving the semiconductor substrate into thin strips.

As shown in FIGS. 2A and 2B, on the semiconductor substrate 1, a plurality of SRAM cells 20 are arranged in an array. Therefore, the n-type FinFETs N1 to N4 adjoining in the y direction share an active region AA-n extending in the y direction. Similarly, the p-type FinFETs P1 to P2 adjoining in the y direction share an active region AA-p extending in the y direction. The n- and p-type FinFETs N1 to N4 adjoining in the x direction share gate electrodes G1 to G4 extending in the x direction.

In the n- and p-type FinFETs N1 to N4, P1 to P2, the intersections of the active regions AA-p, AA-n and the gate electrodes G1 to G4 crossing the regions in three dimensions are channel regions 2 and 5.

The n- and p-type FinFETs N1 to N4, P1 to P2 constitute double-gate MIS transistors with a gate insulating film (not shown) of, for example, about 1 to 3 nm thick on both sides of each of the channel regions 2, 5 of the fin.

In the first embodiment, an SiN film 8 as a mask layer is caused to remain on the channel regions 2, 5. However, the SiN film 8 may be removed and a gate insulating film may be formed not only on the both side faces but also on the top face, thereby producing a FinFET having a channel region formed in it. Moreover, the space between the lower parts of the fins serving as the active regions AA-n, AA-p may be filled with an isolation insulating layer and the fin projecting from the isolation insulating layer may be used as a channel region.

Generally, to suppress the short channel effect, the width of the fin (hereinafter, referred to as the fin width) is set so that the FinFETs N1 to N4, P1 to P2 may be fully depletion-mode MIS transistors. Specifically, the width is set so that the widths W2, W3 of the channel regions of the fin are about ⅔ of the gate length. For example, if the gate length is 20 nm, the widths W2, W3 of the channel regions 2, 5 are set to 12 to 15 nm.

Furthermore, in the first embodiment, the heights (fin heights) H2, H3 of the fins 2, 5 of the FinFETs N1 to N4, P1 to P2 are set to, for example, the same value.

In the SRAM of the first embodiment, the height of the fins of the FinFETs N1, N2 serving as driver transistors are the same as those of the fins of the FinFETs N3, N4 serving as transfer gate transistors. Each of the active regions AA-n of the FinFETs N1, N2 and FinFETs N3, N4 is composed of one fin. Therefore, the current drive power ratio (β ratio) determined by the ratio of the current drive power of the FinFETs N1, N2 as driver transistors to the current drive power of the FinFETs N3, N4 as transfer gate transistors is 1.

Of the fins as the active regions AA-n, AA-p, the parts not covered with the gate electrodes G1 to G4 are source/drain regions. In the source/drain regions, contact plugs CP1 to CP3 are provided. Hereinafter, the regions in which the contact plugs CP1 to CP3 are provided are referred to as contact regions.

The contact region 3 of the drain of the p-type FinFET P1 is connected via the contact plugs CP1, CP2 to the contact region 6 of the drain of the n-type FinFET N1 with a wiring layer (not shown) provided in an higher layer than the contact plugs CP1, CP2, which produces a node ND.

In the first embodiment, in the n-type FinFETs N1 to N4, for example, all of the fins are linear and the fin of the fin width W3 is used as the channel region 5 and contact region 6.

On the other hand, the fins of the p-type FinFETs P1, P2 are not rectangular shape and the fin width W1 of the contact region 3 differs from the fin width W2 of the channel region 2.

That is, of the fins of the p-type FinFETs P1, P2, for example, the channel region 2 has almost the same fin width W2 as the fin width W3 of the n-type FinFETs N1 to N4. Of the contact regions at one end and the other end of the p-type FinFETs, the fin width W1 of the contact region 3 connected to the nodes ND, /ND is wider than the fin widths W2, W3 of the channel regions 2, 5. The fin width W1 of the contact region 3 is set to, for example, 50 to 100 nm.

As described above, the first embodiment is characterized in that, of the fin of the p-type FinFET, the width W1 of the contact region 3 connected to the node is wider than the fin width W3 of the channel region 5 of the fin of the n-type FinFET. Moreover, the fin width W1 of the contact region 3 of the p-type FinFET is wider than the fin width W2 of the channel region 2 of the p-type FinFET.

Figure 2C:
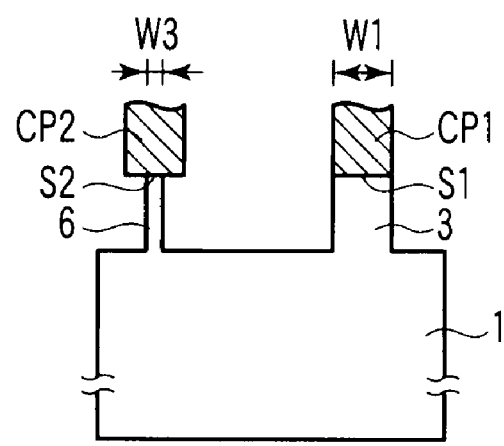
FIG. 2C is a sectional view taken along line IIC-IIC of FIG. 2A.

Accordingly, as shown in FIG. 2C, by making wider the fin width of the contact region 3 of the p-type FinFET connected to the node, the contact area S1 between the contact plug CP1 and the contact region 3 can be made larger than the contact area S2 between the contact plug CP2 and the contact region 6 of the n-type FinFET, or a normally used borderless contact. Consequently, the parasitic resistance of the contact of the contact plug CP1 with the fin can be decreased.

In the FinFETs provided on the bulk semiconductor substrate 1, if the size of the contact region is increased, the size of the source/drain region increases accordingly. Consequently, the p-n junction capacitance between the source/drain of the FinFET and the semiconductor substrate increases.

Therefore, the junction capacitance between the nodes ND, /ND of the inverters 21A, 21B can be increased.

Accordingly, in the SRAM cell 20 including the inverter circuits 21A, 21B, more charges can be stored at the node (the output node of the inverter), and noise from the outside, soft errors caused by radiation, data inversion, and others can be prevented, which enables the SRAM cell to operate stably. Since the n-type FinFET connected to the node has a fin width of W3 throughout the fin, an increase in the junction capacitance in the contact region 6 does not impair the drive characteristic of the n-type FinFET, which prevents the operating speed of the SRAM cell from decreasing and the power consumption from increasing.

As described above, according to the first embodiment, the operating characteristics of the SRAM cell using FinFETs can be improved.

(b) Manufacturing Method

Hereinafter, a method of manufacturing an SRAM including the inverter circuits 21A, 21B using the FinFETs of the first embodiment will be explained using FIGS. 3A to 4B and FIGS. 2A and 2B.

Figure 3A:
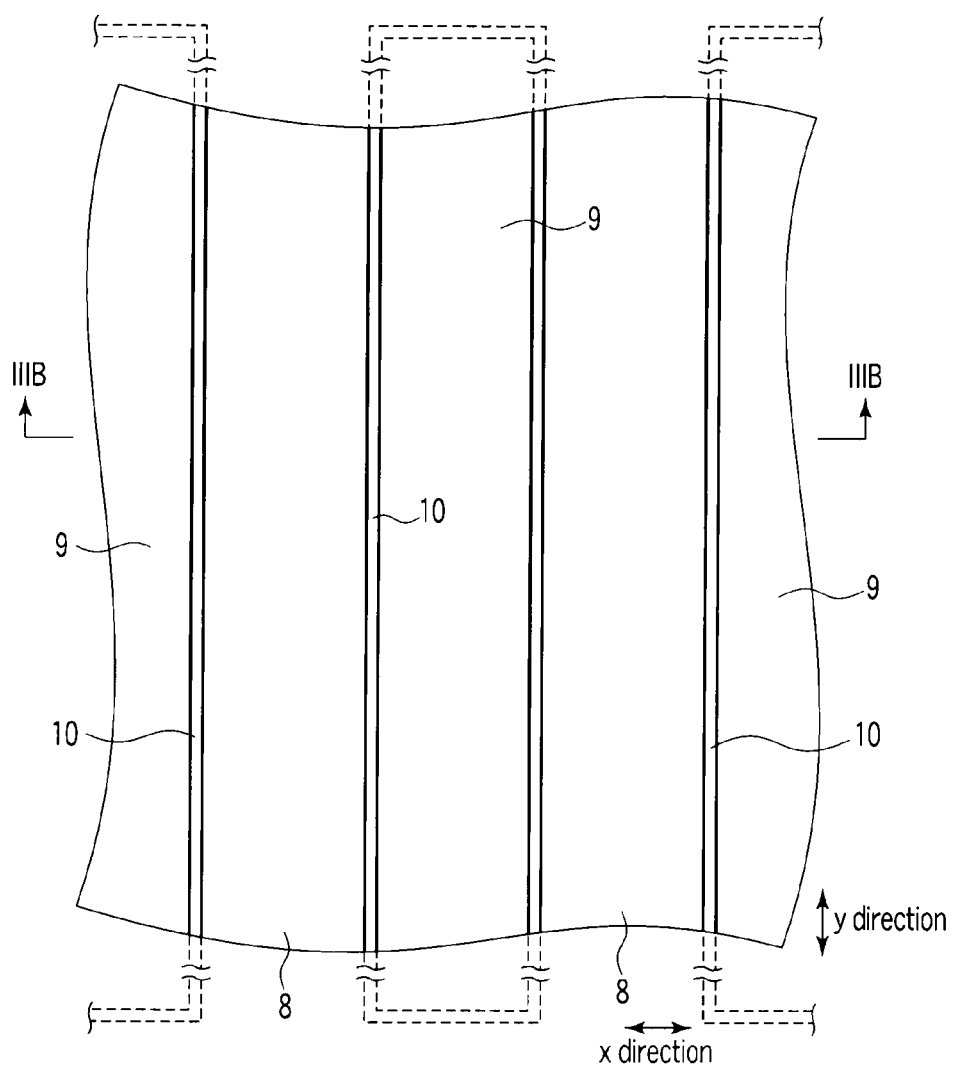
FIG. 3A is a plan view to explain one process in a manufacturing method according to the first embodiment.
Figure 3B:
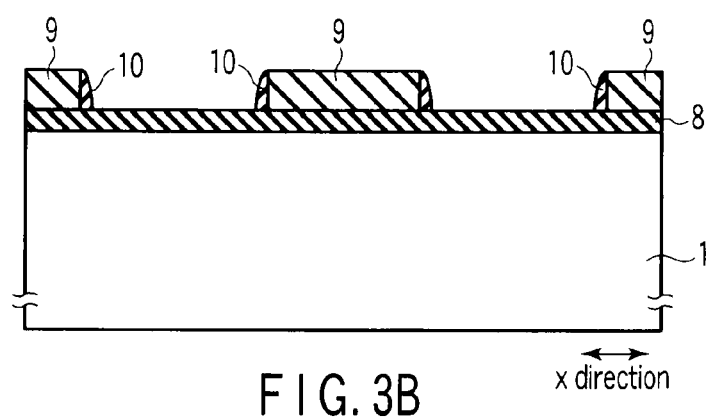
FIG. 3B is a sectional view taken along line IIIB-IIIB of FIG. 3A.

First, using FIGS. 3A and 3B, one process in the manufacturing method will be explained. FIG. 3A is a plan view to explain one process in the manufacturing method. FIG. 3B is a sectional view taken along line IIIB-IIIB of FIG. 3A.

As shown in FIGS. 3A and 3B, on a semiconductor substrate (e.g., an Si (100) plane single-crystal substrate) 1, for example, an SiN layer is deposited as a first mask layer 8 by CVD (Chemical Vapor Deposition) techniques.

Then, on the first mask layer 8, a dummy pattern 9 is formed by, for example, photolithography and RIE (Reactive Ion Etching) or CVD techniques in such a manner that a closed-loop sidewall mask is formed in a fin formation planned region serving as an active region. The dummy pattern 9 is, for example, a TEOS layer.

Thereafter, on the entire surface, for example, a sidewall material made of amorphous silicon is formed. The sidewall material is etched back. Then, a closed-loop sidewall mask 10 surrounding the dummy pattern 9 remains on the mask layer 8 and on the side face of the dummy pattern 9.

The materials used for the first mask layer 8, dummy pattern 9, and sidewall mask 10 are not limited to those described above and may be other suitable ones, provided that the etching selection ratio is secured sufficiently in each etching process.

Figure 4A:
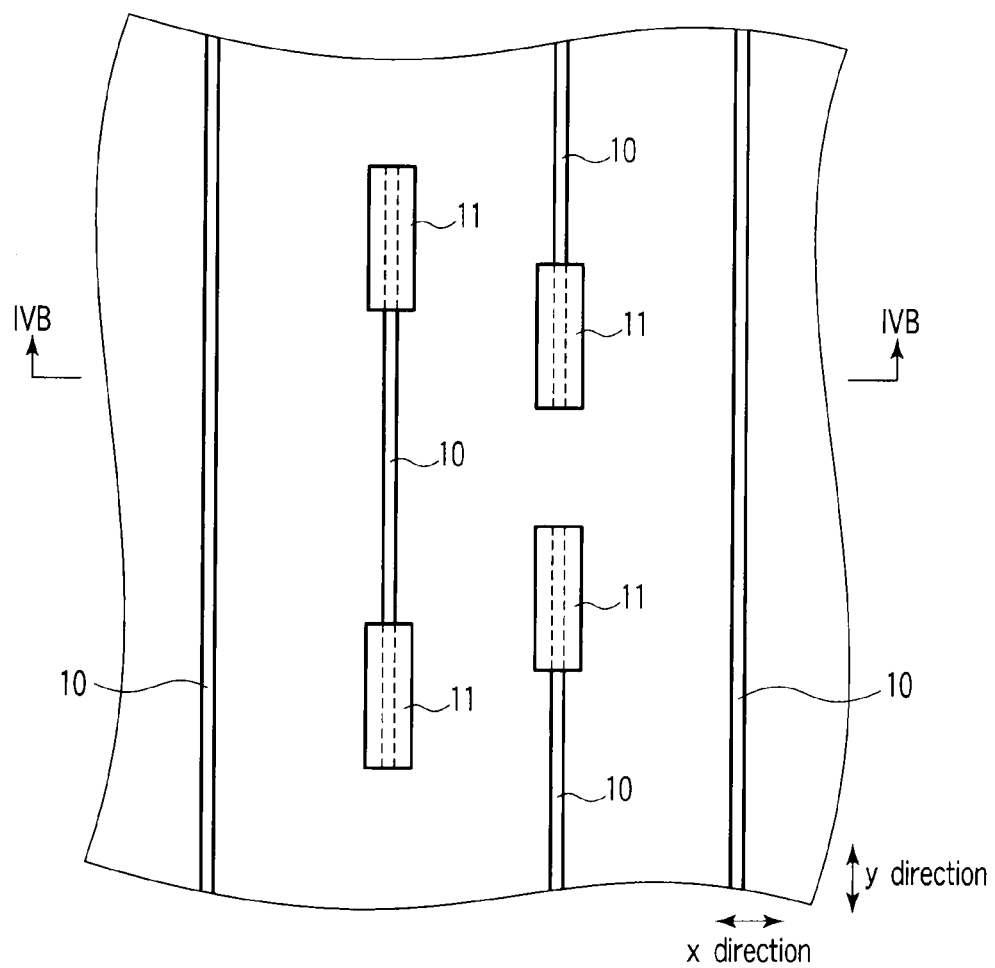
FIG. 4A is a plan view to explain one process in the manufacturing method according to the first embodiment.
Figure 4B:
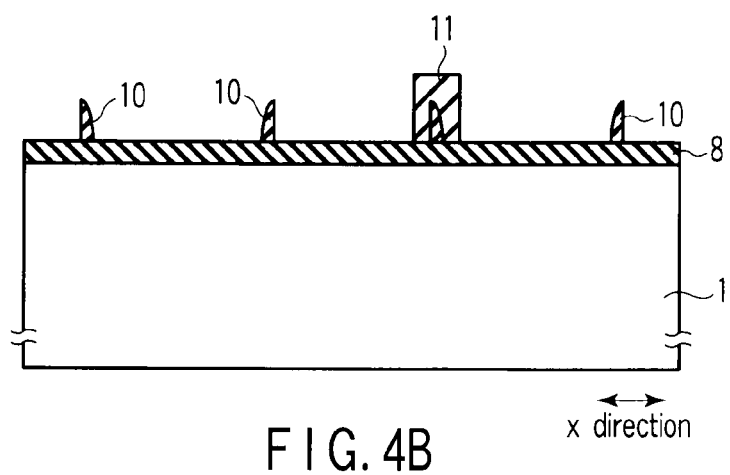
FIG. 4B is a sectional view taken along line IVB-IVB of FIG. 4A.

Next, using FIGS. 4A and 4B, one process of the manufacturing method following FIGS. 3A and 3B will be explained. FIG. 4A is a plan view to explain one process in the manufacturing method. FIG. 4B is a sectional view taken along line IVB-IVB of FIG. 4A.

After the dummy pattern 9 is removed, the closed-loop sidewall mask 10 is trimmed by, for example, RIE techniques so that the sidewall mask 10 may remain on the fin formation planned region.

Then, as shown in FIGS. 4A and 4B, the sidewall mask 10 remains. Moreover, using a resist mask, a second mask layer 11 for forming a contact region whose fin width is wider than the channel region is formed on a p-type FinFET contact region formation planned region.

Then, with the sidewall mask 10 and second mask layer 11 as a mask, the first mask layer 8 and semiconductor substrate 1 are etched by, for example, RIE techniques. Thereafter, the sidewall mask 10 and second mask layer 11 are removed.

Then, as shown in FIGS. 2A and 2B, fins acting as the active regions AA-n, AA-p with a specific layout are formed, respectively.

After the space between the lower portions of the fins is filled suitably with an isolation insulating layer (not shown), a gate insulating film (not shown), such as $SiO_2$, is formed on the side faces of the fins acting as the active regions AA-n, AA-p. Then, gate electrodes G1 to G4 made of, for example, conductive polysilicon are formed by, for example, CVD or RIE techniques so as to cross the active regions AA-n, AA-p in three dimensions according to a specific layout.

After a part of the mask layers on the top surfaces of the active regions AA-n, AA-p are removed, n-type impurities (arsenic or phosphorus) and p-type impurities (boron) are doped into the source/drain regions of the n-type and p-type FinFETs by ion implantation or plasma doping (PLAD) techniques.

Furthermore, after the gate sidewall (not shown) and interlayer insulating layer (not shown) are formed, contact plugs CP1 to CP3 are formed so as to connect with the contact regions 3, 6 of the fins. Thereafter, a wiring layer (not shown) with a specific layout is formed.

By the above manufacturing method, the fin width W1 of the contact region 3 connected to the nodes ND, /ND of the fins of the p-type FinFETs P1, P2 can be made wider than that of each of the fin widths W2, W3 of the channel regions 2, 5 of the n- and p-type FinFETs N1 to N4, P1 to P2.

Therefore, a p-type FinFET where the parasitic resistance of the contact region acting as a node has been reduced and the p-n junction capacitance has been increased can be formed. Moreover, an inverter whose operating stability has been improved can be formed.

Therefore, according to the manufacturing method of the first embodiment, it is possible to provide an SRAM cell whose operating characteristics are improved.

(2) Second Embodiment

Using FIGS. 5A and 5B, a second embodiment of the invention will be explained. In the second embodiment, the same parts as those in the first embodiment are indicated by the same reference numerals and a detailed explanation of them will be omitted.

In the inverter circuits 21A, 21B using the FinFETs of the first embodiment, the fin width W1 of the contact regions 3 of the p-type FinFETs P1 to P2 connected to the nodes ND, /ND is wider than each of the fin widths W2, W5 of the n- and p-type FinFETs N1 to N4, P1 to P2.

The second embodiment is characterized in that not only the width W1 of the contact region 3 of the p-type FinFET but also the width W2A of the channel region 2A of the fin acting as the active region of the p-type FinFET are wider than the width W3 of the channel region of the n-type FinFET.

In the examples of FIGS. 5A and 5B, the width W1 of the contact region 3 is the same as the width W2A of the channel region 2A and the whole of the active region (fin) AA-p of the p-type FinFET P1 is linear. In this case, the width W2A of the channel region of the p-type FinFET P1 is set to, for example, 50 to 100 nm. The width W1 and width W2A are not necessarily equal to each other, provided that each of the width W2A of the channel regions 2A and the width W1 of the contact region 3 of the p-type FinFETs P1, P2 is wider than the width W3 of the channel regions 5 of the n-type FinFETs N1 to N4.

As described above, by making the whole of the fin of the p-type FinFET wider than the width W3 of the fin of the n-type FinFET, not only can the contact area of the contact be increased, but also the p-n junction capacitance between the source/drain regions of the p-type FinFETs and the bulk semiconductor substrate 1 can be increased.

Furthermore, in the p-type FinFETs P1, P2, if the width W2A of the channel region 2A becomes wider, a depletion layer formed on the top gate side in the channel region 2A does not couple with a depletion layer formed on the back gate side, with the result that the FinFETs P1, P2 become partial depletion-mode MIS transistors. Therefore, it is difficult to suppress the short channel effect as in a fully depletion-mode MIS transistor.

Therefore, in the second embodiment, impurities (e.g., phosphorus or arsenic) are doped into the channel region 2A of the p-type FinFET by, for example, ion implantation techniques so as to obtain such an impurity concentration as achieves a specific threshold voltage and drain induced barrier lowering (DIBL).

Accordingly, the impurity concentration of the channel regions 2A of the p-type FinFETs P1, P2 is set higher than the impurity concentration of the channel regions 5 of the n-type FinFETs N1 to N4. For example, the impurity concentration of the channel regions 2A of the p-type FinFET is set to about $1 \times 10^{18}/cm^3$ to $3 \times 10^{18}/cm^3$ and the impurity concentration of the channel region 5 of the n-type FinFET is set to about $5 \times 10^{17}/cm^3$ to $9 \times 10^{17}/cm^3$.

Since an ordinary FinFET is a fully depletion-mode MIS transistor, even if the impurity concentration in the channel region is made as low as possible, the short channel effect can be suppressed, taking advantage of the double gate structure. At the same time, a variation in the electric characteristics caused by a variation in the positions and the number of impurities (Random Dopant Fluctuation) can be suppressed.

On the other hand, if the FinFET is a partial depletion-mode MIS transistor as the p-type FinFETs P1, P2 of the second embodiment, the variation of the electric characteristics, such as the threshold voltage, may increase in each of the p-type FinFETs arranged on the same substrate.

However, the write characteristic and data-retention characteristic of the SRAM cell are determined by the characteristics of the driver transistor and transfer gate transistor.

Therefore, in the second embodiment, even if the p-type FinFETs P1, P2 become partial depletion-mode MIS transistors and their characteristics vary, this doesn't have a great effect on the variation of the characteristics of the SRAM cell, since the driver transistor and transfer gate transistor are fully depletion-mode n-type FinFETs N1 to N4.

Therefore, according to the second embodiment, it is possible to stabilize the operation of the inverter circuits using FinFETs and that of the SRAM cells using the inverter circuits and therefore improve the operating characteristics of the SRAM cells.

In the first embodiment, the channel region 2 of the p-type FinFET is formed in the smallest line width pattern by the manufacturing process using a sidewall mask.

However, as in the second embodiment, when each of the fin widths W1, W2 as the active regions AA-p of the p-type FinFETs P1, P2 is wider than the smallest line width and all of the fin widths are set to 50 to 100 nm as in the above example, all of the active regions AA-p of the p-type FinFETs P1, P2 can be formed by a process using resist.

Accordingly, when SRAM cells are formed on the semiconductor substrate 1, not only the process using the sidewall for forming the smallest line width but also the process using resist can be used.

Moreover, the active region (fin) of the p-type FinFET is formed into a linear pattern, which makes it easier to form a pattern than in the first embodiment.

Consequently, according to the second embodiment, it is possible to improve the operating characteristics of the semiconductor circuit using FinFETs, solve a lithographic problem, and increase the freedom of layout design and manufacturing process of SRAM cells.

(3) Third Embodiment

Figure 6A:
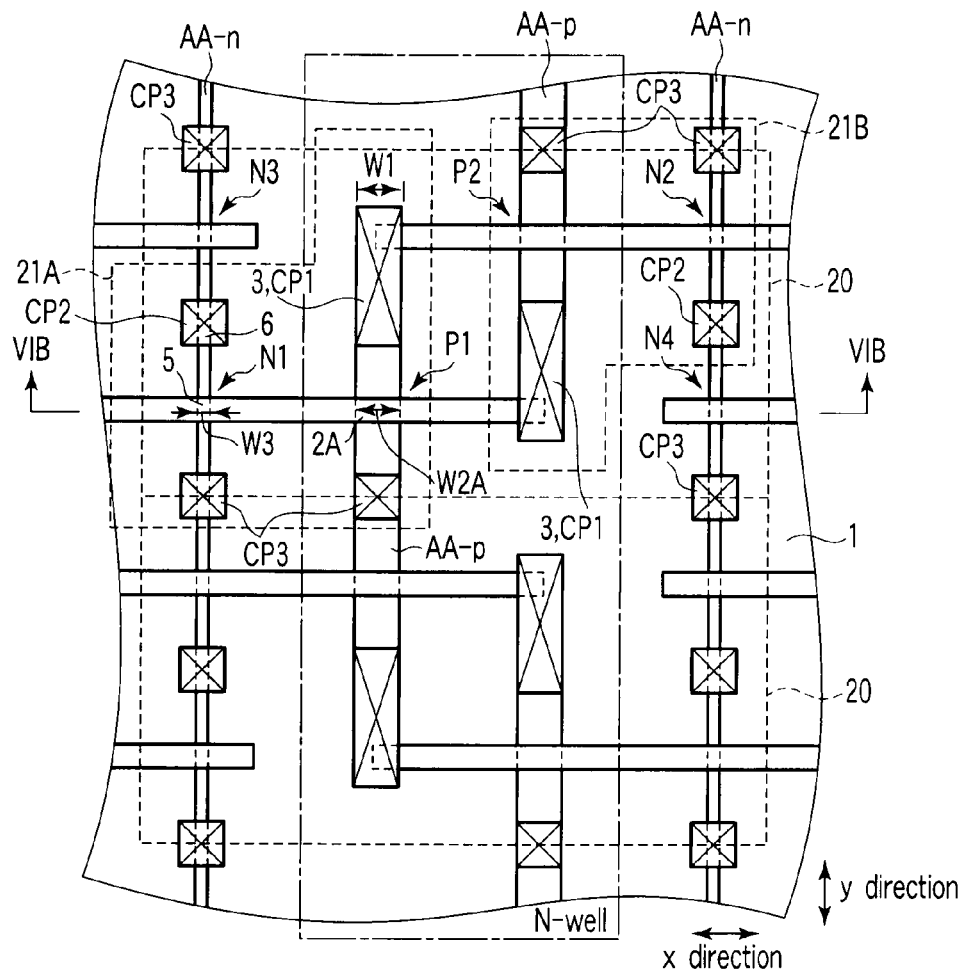
FIG. 6A is a plan view showing the configuration of a third embodiment of the invention.
Figure 6B:
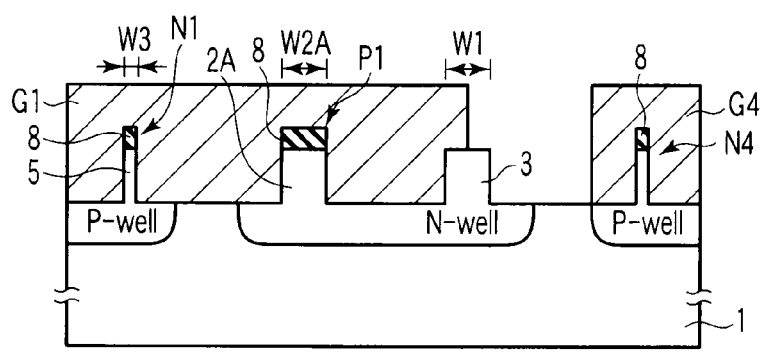
FIG. 6B is a sectional view taken along line VIB-VIB of FIG. 6A.

Using FIGS. 6A and 6B, a third embodiment of the invention will be explained. In the third embodiment, the same parts as those in the first and second embodiments are indicated by the same reference numerals and a detailed explanation of them will be omitted.

The third embodiment is characterized in that an n-well region N-well is further provided in the semiconductor substrate 1 in addition to the configuration of the second embodiment and that a p-type FinFET is arranged in the n-well region N-well. The impurity concentration in the n-well region N-well is, for example, about $10^{17}/cm^3$ to $10^{18}/cm^3$. In this case, a p-well region P-well is provided in the semiconductor substrate 1 in a region where an n-type FinFET is arranged.

Since an ordinary FinFET is a fully depletion-mode MIS transistor, a change in the electric characteristics caused by a substrate bias is small.

However, in the p-type FinFETs P1, P2 of the third embodiment, the fin width W2A of the channel region 2A is wider and channel doping has been done, with the result that the p-type FinFETs P1, P2 are partial depletion-mode MIS transistors.

Accordingly, a substrate bias voltage is applied to the n-well region N-Well where the p-type FinFETs P1, P2 are arranged. With this substrate bias effect, the electric characteristics of the p-type FinFETs can be varied.

Specifically, a substrate bias voltage of, for example, about −0.5 to −0.6V is applied to the n-well region N-well so that the bias voltage may be applied to the p-type FinFETs P1, P2 in the forward direction.

As a result of the application of the bias voltage, the width of the depletion layer formed between all of the fins as the active region AA-p and the n-well region N-well can be decreased and therefore the junction capacitance between the source/drain region and n-well region N-well can be increased.

Accordingly, the substrate bias effect enables the electric characteristics, including the threshold voltage of the p-type FinFET, to be varied.

Consequently, it is possible to stabilize the operation of the inverter circuits composed of FinFETs and that of the SRAM cells using the inverter circuits and therefore improve the drive characteristic of the SRAM cells.

(4) Fourth Embodiment (a) Configuration

Using FIGS. 7A and 7B, a fourth embodiment of the invention will be explained. In the fourth embodiment, the same parts as those in the first to third embodiments are indicated by the same reference numerals and a detailed explanation of them will be omitted.

In the first to third embodiments, a semiconductor substrate in which the n- and p-type FinFETs N1 to N4, P1 to P2 are provided has been a bulk semiconductor substrate.

The semiconductor substrate in which the n-type and p-type FinFETs N1 to N4, P1 to P2 are provided is not limited to a bulk semiconductor substrate and may be, for example, a silicon-on-insulator (SOI) substrate. An example of arranging n-type and p-type FinFETs constituting an inverter circuit on an SOI substrate will be explained.

Figure 7A:
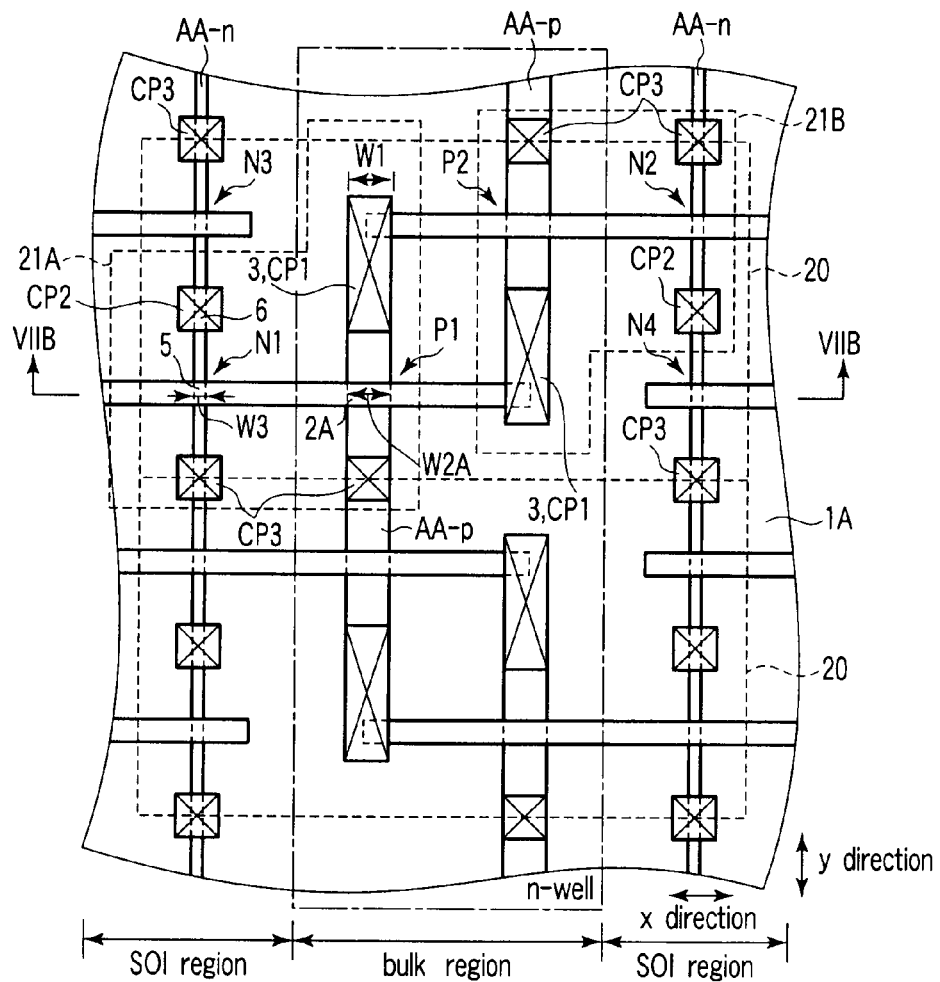
FIG. 7A is a plan view showing the configuration of a fourth embodiment of the invention.
Figure 7B:
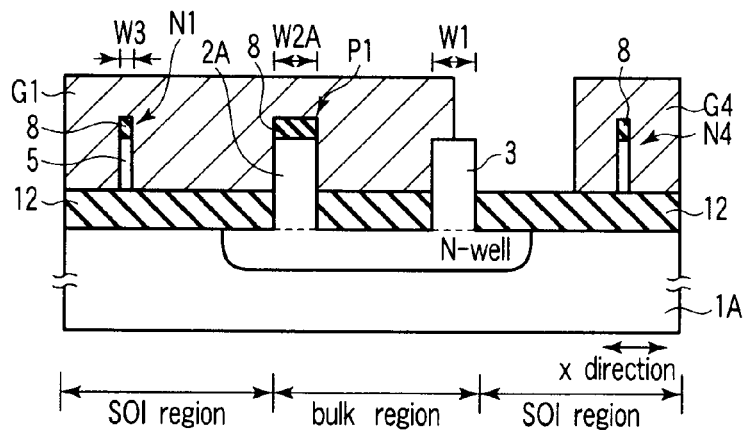
FIG. 7B is a sectional view taken along line VIIB-VIIB of FIG. 7A.

As shown in FIGS. 7A and 7B, a semiconductor substrate 1A is a so-called partial SOI substrate composed of a bulk region and an SOI region.

In the bulk region of the semiconductor substrate 1, p-type FinFETs P1, P2 are arranged. In the SOI region, n-type FinFETs N1 to N4 are arranged.

When the p-type FinFETs P1, P2 are arranged in the bulk region, the p-type FinFETs P1, P2 produces the same effect as in the first to third embodiments.

When the n-type FinFETs N1 to N4 are arranged in the SOI region, since the junction capacitance is low, the operating speed of the n-type FinFET can be increased and its threshold voltage can be decreased. Consequently, it is possible to increase the operating speed of the inverter circuits and that of the SRAM cells including the inverter circuits and decrease the power consumption.

Furthermore, if an N-well region N-well is provided in a region of the semiconductor substrate 1 where a p-type FinFET is arranged as in the third embodiment, a P-well region P-well has to be provided in the region where the n-type FinFET has been arranged. In this case, to suppress the influence of a parasitic transistor originating in the two well regions, a region for isolating the two well regions (well isolating region) from each other has to be secured.

In the fourth embodiment, however, the n-type FinFET is arranged in the SOI region and is electrically separated from the bulk region by the SOI insulating layer 12.

Therefore, according to the fourth embodiment, the well isolating region has not be secured, which reduces the occupied area of the inverter circuits and the SRAM cells including the inverter circuits.

Moreover, with the manufacturing method of the fourth embodiment, the channel plane of each of the n-type and p-type FinFETs can be set to a different Si crystal plane.

Specifically, the channel planes of the n-type FinFETs N1 to N4 can be designed to be an Si (100) plane and the channel planes of the p-type FinFETs P1, P2 can be designed to be an Si (110) plane.

In this case, in the n-type FinFETs N1 to N4, their carriers (electrons) move along the Si (100) plane. In the p-type FinFETs P1, P2, their carriers (holes) move along the Si (110) plane.

In the Si (110) plane, the mobility of holes, carries in the p-type FinFET, is about twice the mobility when the channel plane is the Si (100) plane. Accordingly, the drive characteristic of the p-type FinFET can be increased.

Consequently, the drive characteristic (current-voltage characteristic) of the n-type FinFET and that of the p-type FinFET can be made almost the same. Therefore, the inverter circuits can be controlled easily.

Accordingly, in the fourth embodiment, the FinFETs N1 to N4, P1 to P2 constituting the inverter circuits 21A, 21B are provided on the partial SOI substrate 1A, thereby making it possible to improve the drive characteristic of the SRAM cells 20 including the inverter circuits 21A, 21B. Moreover, the occupied area of the SRAM cells 20 can be reduced. Furthermore, the inverter circuits 21A, 21B and the SRAM cells using the inverter circuits can be controlled easily.

(b) Manufacture Example

Hereinafter, using FIGS. 8A to 10B, a manufacture example according to the fourth embodiment will be explained.

Figure 8A:
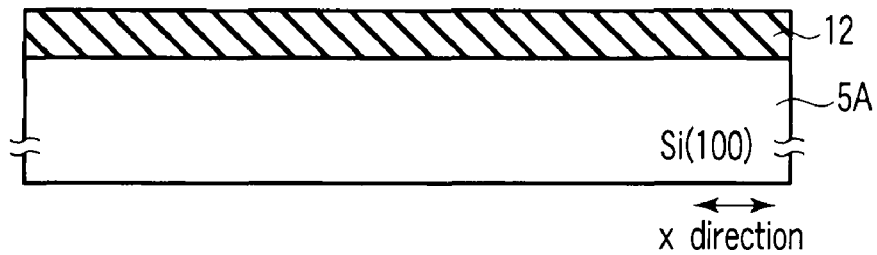
FIG. 8A is a sectional view to explain a process in a manufacturing method according to the fourth embodiment.

First, as shown in FIG. 8A, for example, an SOI insulating film 12 (e.g., SiO$_2$) is formed on an Si (100) plane single-crystal substrate 5A. Then, hydrogen ions are implanted into the Si (100) plane single-crystal substrate 5A.

Thereafter, for example, an Si (110) plane substrate differing from the Si (100) plane single-crystal substrate 5A in plane direction is laminated to the SOI insulating layer 12.

Figure 8B:
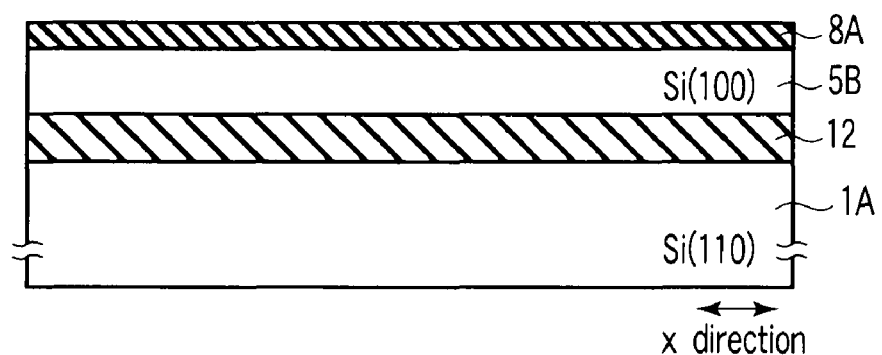
FIG. 8B is a sectional view to explain a process in a manufacturing method according to the fourth embodiment.

Next, after the laminated substrate is annealed, the Si (100) plane single-crystal substrate 5A is cleaved. Then, as shown in FIG. 8B, an Si (100) plane SOI layer 5B is formed on the surface of the SOI insulating layer 12 on the Si (110) plane single-crystal substrate 1A. Then, on the top face of the SOI layer 5B, for example, an SiN layer is deposited as a first mask layer 8A.

Figure 8C:
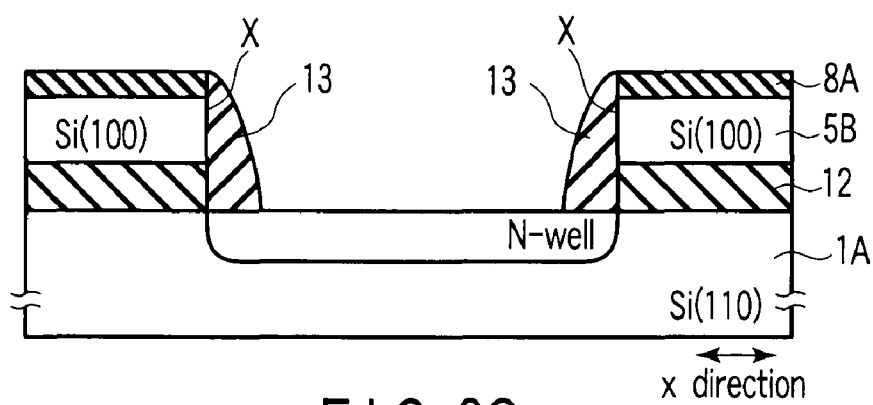
FIG. 8C is a sectional view to explain a process in a manufacturing method according to the fourth embodiment.

Then, as shown in FIG. 8C, an opening X is made so that the top face of the Si (110) plane single-crystal substrate 1A may be exposed in the p-type FinFET formation planned region. Thereafter, on the side face of the opening X, for example, a dummy sidewall mask 13 made of SiN is formed. In this case, an n-well region N-well may be formed by, for example, ion implantation techniques in the Si (110) plane single-crystal substrate 1A.

Next, as shown in FIG. 9A, an Si (110) plane single-crystal layer 1B is formed only on the Si (110) plane single-crystal substrate 1A in the p-type FinFET formation planned region by, for example, a selective epitaxial growth method. Alternatively, an amorphous Si layer may be formed in the opening X, followed by heat treatment, and then an Si (110) plane single-crystal layer may be formed by solid-phase epitaxial growth.

Then, after the first mask 8A is removed, the top face of the substrate is planarized by, for example, CMP techniques. On the planarized top face, a second mask layer (e.g., SiN) 8B is formed.

Then, as shown in FIG. 9B, the second mask layer 8B is patterned by, for example, photolithographic and RIE techniques so as to expose the boundary between the n-type FinFET formation planned region and p-type FinFET formation planned region.

Thereafter, with the second mask layer 8B as a mask, the Si (100) plane single-crystal layer 5B, Si (110) plane single-crystal layer 1B, and SOI insulating layer 12 are each etched by, for example, RIE techniques. Moreover, the second mask layer 8B and dummy sidewall mask 13 are removed by, for example, wet etching.

Next, as shown in FIG. 9C, for example, an SiN film as a third mask layer 8 is formed on the entire surface. On the top surface of the mask layer 8, a sidewall mask 10 and a resist mask 11 are formed by the same processes as in the first and second embodiments in such a manner that fins with specific fin widths are formed in the n- and p-type FinFET formation planned regions.

Then, using the masks 10, 11, the mask 8, Si (100) plane single-crystal layer 5B, and Si (110) plane single-crystal layer 1B are etched by, for example, RIE techniques.

Thereafter, after the masks 10, 11 are removed, fins 2A, 3, 5 with specific fin widths are formed in the n- and p-type FinFET formation planned regions as shown in FIG. 10A.

Then, as shown in FIG. 10B, on the entire surface of the Si (110) plane single-crystal substrate 1A, SiO$_2$ is formed by, for example, dense plasma CVD techniques. The insulating layer is planarized by, for example, CMP and etching-back techniques, thereby forming an insulating layer 12A on the Si (110) plane single-crystal substrate 1A.

Thereafter, by the same processes as in the first embodiment, gate electrodes G1, G4 are formed according to a specific layout and then a source, a drain, and contact plugs are formed sequentially.

By the above processes, an n-type FinFET N1 whose channel plane is a silicon (100) plane is formed in the SOI region. Moreover, a p-type FinFET P1 whose channel plane is a silicon (110) plane is formed in the bulk region.

Accordingly, by the above manufacturing method, it is possible to provide an inverter circuit whose operating characteristics have been improved and an SRAM including the inverter.

(5) Modification

Hereinafter, a modification of the first to fourth embodiments will be explained. The same parts as those in the first to fourth embodiments are indicated by the same reference numerals and a detailed explanation of them will be omitted.

In the first to fourth embodiments, an SRAM cell so configured that the β ratio indicating the operating stability of the SRAM is 1 has been explained. However, the embodiments of the invention are not limited to the SRAM cell with the β ratio=1.

If the current drive of the driver transistors N1, N2 is Idr and the current drive of the transfer gate transistors N3, N4 is Itr, the β ratio is expressed as:

$$\beta = Idr(N1)/Itr(N3) = Idr(N2)/Itr(N4)$$

That is, the β ratio can be increased by improving the current drive powers Idr(N1), Idr(N2) of the driver transistors more than the current drive powers Itr(N3), Itr(N4) of the transfer gate transistors.

As described above, in the FinFETs, the current drive can be increased by increasing the number of fins.

Figure 11A:
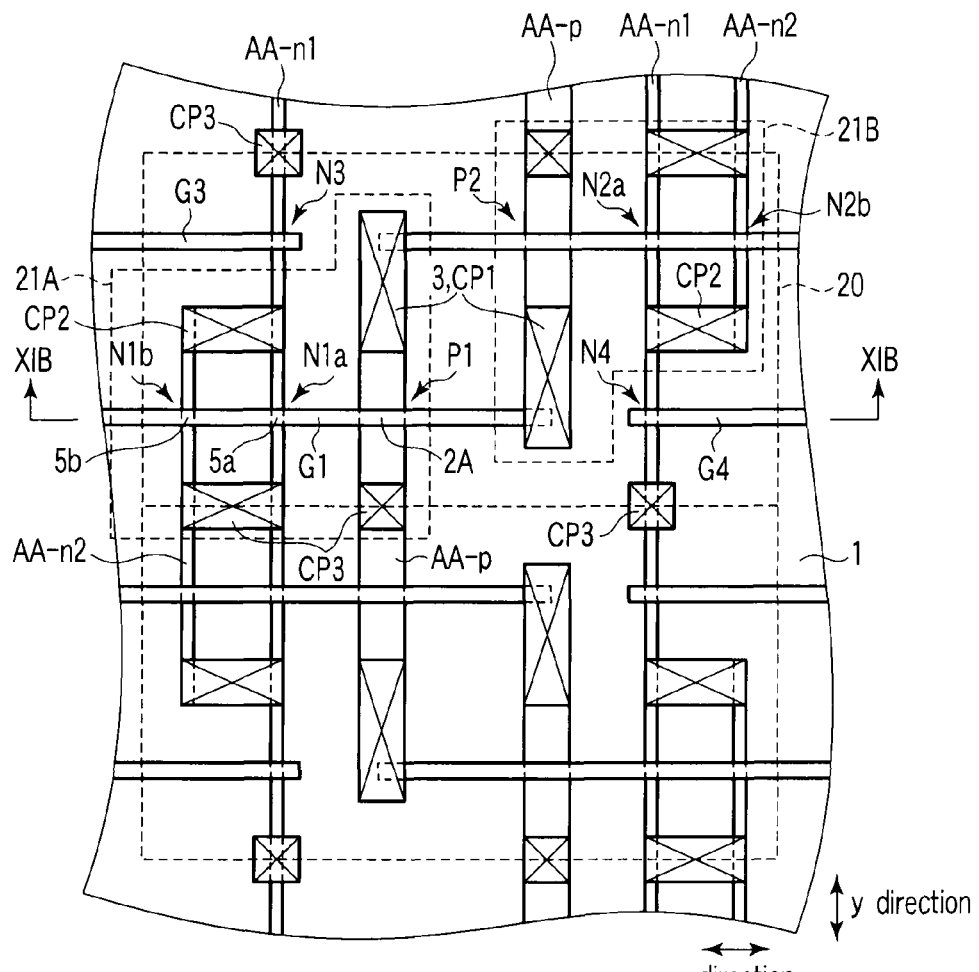
FIG. 11A is a plan view showing the structure of a modification.
Figure 11B:
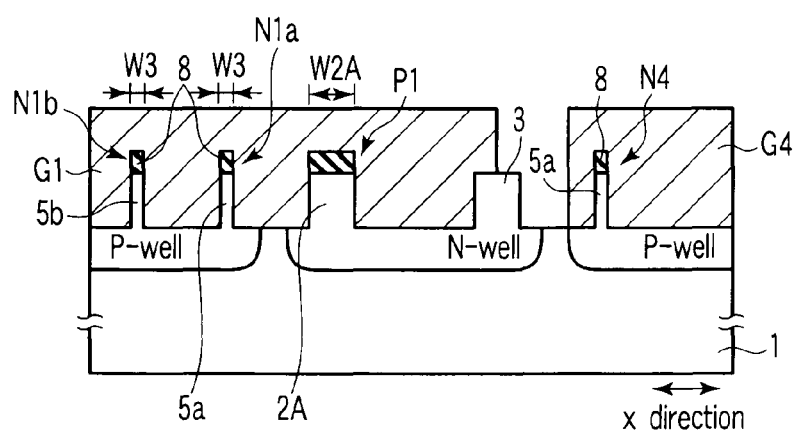
FIG. 11B is a sectional view taken along line XIB-XIB of FIG. 11A.

In the examples shown in FIGS. 11A and 11B, n-type FinFETs N1a, N1b, N2a, N2b constituting a driver transistor are composed of fins acting as two active regions AA-n1, AA-n2. The two n-type FinFETs N1a, N1b are connected in parallel with each other by contact plugs CP2, CP3.

In this case, the current drive power of the driver transistor composed of two fins is twice that of the transfer gate transistor composed of one fin.

Therefore, in the example shown in FIGS. 11A and 11B, the β ratio of the SRAM can be set to "2."

Accordingly, with the modification, increasing the β ratio of the SRAM cell makes it possible to further improve the operating stability of the SRAM cell and the drive characteristic of the SRAM cell including the inverter circuit composed of FinFETs.

While in the embodiments, the number of fins of the n-type FinFETs constituting a driver transistor has been two, the invention is not limited to this. For instance, the number of fins may be more than two. Moreover, while in the modification, the third embodiment has been used as the basic structure. The invention is not restricted to this. For instance, one of the other embodiments may be used as the basic structure.

(b) Manufacturing Method

Hereinafter, a manufacturing method according to the modification will be explained.

First, as shown in FIGS. 12A and 12B, well regions N-well, P-well are formed in a semiconductor substrate 1. Thereafter, by the same method as in the first embodiment, a mask layer 8 and a dummy pattern 9 are formed. On the side face of the dummy pattern 9 in an n-type FinFET formation planned region, a closed-loop sidewall mask 10 is formed.

Next, after the dummy pattern 9 is removed, the closed-loop sidewall mask 10 is trimmed as shown in FIGS. 13A and 13B so that a sidewall mask 10 with a two-line pattern may remain in the region where an n-type FinFET acting as a driver transistor is to be formed. Then, in a p-type FinFET formation planned region, a resist mask 11 with a pattern where the fin width of the p-type FinFET is greater than that of the n-type FinFET is formed.

Thereafter, using the sidewall mask 10 and resist mask 11, the mask layer 8 and semiconductor substrate 1 are etched by, for example, RIE techniques, thereby forming fins 5a, 5b as two active regions in the region where an n-type FinFET acting as a driver transistor is to be formed as shown in FIG. 14. Moreover, in the p-type FinFET formation planned region, fins 2A, 3A serving as active regions are formed. The fin widths W1, W2A of the fins 2A, 3 of the p-type FinFET are greater than the fin width W3 of the fins 5a, 5b of the n-type FinFET.

Thereafter, as shown in FIGS. 11A and 11B, by the same method as in the first embodiment, gate electrodes G1 to G4, a gate sidewall (not shown), an interlayer insulating layer (not shown), a source/drain diffused layer (not shown), contact plugs CP1 to CP3 are formed sequentially.

By the above processes, an SRAM cell with the β ratio=2 using FinFETs can be formed.

Accordingly, it is possible to form SRAM cells with an improved operating stability and provide an SRAM including inverter circuits composed of FinFETs with improved drive characteristics.

While the manufacturing method of forming FinFETs on the bulk semiconductor substrate as in the first to third embodiments has been explained, the modification may be applied to a manufacturing method of forming FinFETs on an SOI substrate as in the fourth embodiment.

4. Others

In the first to fourth embodiments and the modification, the characteristics and effects of the invention have been explained using the SRAM including inverter circuits composed of FinFETs. However, the invention is not applied only to the SRAM. Even when the invention is applied to a logic circuit, such as a NAND gate circuit, using inverter circuits composed of FinFETs according to the embodiments, the drive characteristics can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a semiconductor substrate;
an n-type FinFET which is provided on the semiconductor substrate and which includes a first fin acting as an active region, a first gate electrode crossing a channel region of the first fin via a gate insulating film in three dimensions, and contact regions provided at one end and the other end of the first fin and sandwiching the channel region;
a p-type FinFET which is provided on the semiconductor substrate and which includes a second fin acting as an active region, a second gate electrode crossing a channel region of the second fin via a gate insulating film in three dimensions, and contact regions provided at one end and the other end of the second fin and sandwiching the channel region,
wherein the n-type FinFET and the p-type FinFET constitute an inverter circuit, and
a channel width of the p-type FinFET is equal to a channel width of the n-type FinFET,
the fin width of the contact region of the p-type FinFET to act as an output node of the inverter circuit is greater than the fin width of the channel region of the n-type FinFET,
a dimension in a direction parallel to a source-drain direction of the contact region, which acts as the output node of the inverter circuit, of the p-type FinFET is greater than a dimension in a direction parallel to a source-drain direction of the contact region, which acts as the output node of the inverter circuit, of the n-type FinFET, and
the fin width of the channel region of the p-type FinFET is greater than the fin width of the channel region of the n-type FinFET.

2. The semiconductor device according to claim 1, wherein the impurity concentration of the channel region of the p-type FinFET is higher than the impurity concentration of the channel region of the n-type FinFET.

3. The semiconductor device according to claim 1, further comprising an n-well region provided in the semiconductor substrate,
wherein the p-type FinFET is provided in the n-well region and a bias voltage is applied to the n-well region.

4. The semiconductor device according to claim 1, wherein the semiconductor substrate is composed of an SOI region and a bulk region and the n-type FinFET is arranged in the SOI region and the p-type FinFET is arranged in the bulk region.

5. The semiconductor device according to claim 1, wherein the channel plane of the n-type FinFET is an Si (100) plane and the channel plane of the p-type FinFET is an Si (110) plane.

* * * * *